United States Patent [19]

Ishikawa et al.

[11] Patent Number: 5,175,076
[45] Date of Patent: Dec. 29, 1992

[54] WATER-DEVELOPABLE PHOTOSENSITIVE COMPOSITION FOR PRODUCING RELIEF PLATES

[75] Inventors: Katsukiyo Ishikawa, Kyoto; Hidefumi Kusuda, Osaka; Katsuji Konishi, Ibaraki, all of Japan

[73] Assignee: Nippon Paint Co., Ltd., Osaka, Japan

[21] Appl. No.: 805,671

[22] PCT Filed: Sep. 22, 1987

[86] PCT No.: PCT/US87/02372
§ 371 Date: Jul. 12, 1990
§ 102(e) Date: Jul. 12, 1990

[87] PCT Pub. No.: WO88/02135
PCT Pub. Date: Mar. 24, 1988

Related U.S. Application Data

[63] Continuation of Ser. No. 367,773, Jul. 12, 1990, abandoned, which is a continuation-in-part of Ser. No. 910,134, Sep. 22, 1986, abandoned.

[51] Int. Cl.$^5$ .................................................. G03C 1/73
[52] U.S. Cl. .................................... 430/281; 430/18; 430/286; 430/306; 430/325; 430/910; 430/919; 430/920
[58] Field of Search ............... 430/18, 286, 306, 325, 430/910, 919, 920, 281

[56] References Cited

U.S. PATENT DOCUMENTS

| | | | |
|---|---|---|---|
| 3,801,328 | 4/1974 | Takimoto et al. | 96/115 P |
| 4,239,849 | 12/1980 | Lipson et al. | 430/910 |
| 4,289,843 | 9/1981 | Boutle et al. | 430/910 |
| 4,464,457 | 8/1984 | Bosse et al. | 430/910 |
| 4,485,167 | 11/1984 | Briney et al. | 430/910 |
| 4,537,855 | 8/1985 | Ide et al. | 430/910 |
| 4,621,243 | 11/1986 | Gervey | 430/910 |

*Primary Examiner*—Jack P. Brammer
*Attorney, Agent, or Firm*—Lyon & Lyon

[57] ABSTRACT

A water-developable photosensitive resin plate suitable for the manufacture of a relief printing plate having high resistance to water-based inks, high resilience and excellent form stability, which comprises:

(A) a copolymer comprising units of (i) an aliphatic conjugated diene monomer (ii) and $\alpha, \beta$-ethylenically unsaturated carboxylic acid and (iii) a polyfunctional vinyl monomer, optionally with (iv) a monofunctional vinyl monomer, the content of the aliphatic conjugated diene monomer (i), the $\alpha, \beta$-ethylenically unsaturated carboxylic acid (ii), the polyfunctional vinyl monomer (iii) and the monofunctional vinyl monomer (iv) being respectively from about 5 to 95 mol %, from about 1 to 30 mol %, from about 0.1 to 10 mol % and 0 to 70 mol % based on the combination of those monomeric components;

(B) a basic nitrogen atom-containing compound;
(C) an ethylenically unsaturated monomer; and
(D) a photopolymerization initiator.

7 Claims, No Drawings

WATER-DEVELOPABLE PHOTOSENSITIVE COMPOSITION FOR PRODUCING RELIEF PLATES

RELATED APPLICATION

This is a continuation of co-pending application Ser. No. 07/367,773, filed on Jul. 12, 1990 now abandoned which is a continuation-in-part of copending application, Ser. No. 910,134, filed Sep. 22, 1986, now abandoned entitled "Water-Developable Photosensitive Plate and Its Production".

FIELD OF THE INVENTION

This invention relates to a water-developable photosensitive plate and its production. More particularly, it relates to a water-developable photosensitive resin plate having a solid form stability, which is suitable for the manufacture of a printing plate, especially a relief printing plate, having excellent chemical and physical properties such as high resistance to water based inks, high abrasion resistance and good resilience.

BACKGROUND OF THE INVENTION

A photosensitive resin plate for the manufacture of a relief printing plate is preferably developable with water rather than organic solvents for various reasons such as easiness of handling, health of the working people, safety, and avoidance of environmental pollution. On printing with a relief printing plate resulting from the photosensitive resin plate, it is also very desirable to be able to use water based inks, because oil based inks tend to mist and hence to cause health problems. In addition, the use of water based inks is favored in that the resulting print will not show through the printed paper from one side to the other and does not tend to rub off on the fingers.

There are various known photosensitive resin plates. The photosensitive resin compositions for those conventional photosensitive resin plates are based on liquid unsaturated polyesters, polyvinyl alcohols, water soluble polyamides, cellulose acetate succinates, alcohol soluble polyamides, etc. All these materials, however, suffer from significant disadvantages. For instance, the liquid unsaturated polyesters are inconvenient to handle and necessitate the use of an alkaline solution or a special air knife for developing. The polyvinyl alcohols and the water soluble polyamides have extremely low resistance to water, and consequently water based inks are not usable. The cellulose acetate succinates require the use of an alkaline solution for development, and the alcohol soluble polyamides require the use of an inflammable alcohol.

U.S. Pat. No. 3,801,328 discloses a water developable photopolymerizable composition for preparation of a photosensitive resin plate, said composition comprising unsaturated ethylenic monomers, a photo-polymerization initiator and a partially saponified polyvinyl acetate. This composition has been found to be developed very satisfactorily with water to give a relief printing plate. However, the water resistance of this relief printing plate at the surface is low, which in turn precludes its use with a water based ink.

SUMMARY OF THE INVENTION

According to this invention, there is provided a water developable photosensitive resin plate suitable for the manufacture of a relief printing plate highly resistant to water based inks, which comprises (A) a copolymer comprising (i) an aliphatic conjugated diene monomer, (ii) an $\alpha, \beta$-ethylenically unsaturated carboxylic acid and (iii) a polyfunctional vinyl monomer, optionally with (iv) a monofunctional vinyl monomer, the content of the aliphatic conjugated diene monomer (i), the $\alpha, \beta$-ethylenically unsaturated carboxylic acid (ii), the polyfunctional vinyl monomer (iii) and the monofuntional vinyl monomer (iv) being respectively from about 5 to 95 mol %, from about 1 to 30 mol %, from about 0.1 to 10 mol % and 0 to 70 mol % based on the combination of those monomeric components, (B) a basic nitrogen atom-containing compound, (C) an ethylenically unsaturated monomer and (D) a photopolymerization initiator.

As stated above, the photosensitive resin plate of the invention is characterized by good water developability, and the printing plate obtained therefrom is characterized by high water resistance. Both the photosensitive resin plate and the printing plate are also characterized by having excellent solid form stability, i.e., shape and size stability. In addition, the printing plate has high abrasion resistance and good resilience. Therefore, the printing plate is particularly suitable for flexographic printing, which is often carried out with water based inks.

DESCRIPTION OF PREFERRED EMBODIMENTS

The photosensitive resin plate of the invention comprises a polymerizable composition comprising the components (A), (B), (C) and (D), as defined above, applied in an appropriate form such as a layer, a film, a sheet or a plate, on an appropriate support material such as a plastic plate, a plastic sheet, a metal plate or a metal sheet.

The copolymer (A) comprises units of the components (i), (ii) and (iii) as the essential components, with or without units of the optional component (iv). The copolymer (A) comprises units of the aliphatic conjugated diene monomer (i), the $\alpha, \beta$-ethylenically unsaturated carboxylic acid (ii) and the polyfunctional vinyl monomer (iii), respectively, in amounts of 5 to 95 mol % (preferably from 40 to 85 mol %), 1 to 30 mol % (preferably from 2.5 to 10 mol %) and 0.1 to 10 mol % (preferably from 0.5 to 3 mol %), on the basis of the combination of all the monomeric components therein. Further, the copolymer (A) may comprise optionally units of the monofunctional vinyl monomer (iv) in an amount of not more than 70 mol %, on the basis of the combination of all the monomeric components therein.

Examples of the aliphatic conjugated diene monomer (i) are butadiene, isoprene, dimethylbutadiene, chloroprene, etc. Examples of the $\alpha, \beta$-ethylenically unsaturated carboxylic acid (ii) are acrylic acid, methacrylic acid, maleic acid, fumaric acid, citraconic acid, crotonic acid, etc. Examples of the polyfunctional vinyl monomer (iii) are trimethylolpropane di(meth)acrylate, trimethylolpropane tri(meth)acrylate, divinylbenzene, ethylenglycol di(meth)acrylate, pentaerythritol tri(meth)acrylate, pentaerythritol tetra(meth)acrylate, 1,4-butanediol di(meth)arylate, 1,6-hexanediol di(meth)acrylate, etc. Examples of the monofunctional vinyl monomer (iv) are styrene, $\alpha$-methylstyrene, vinyltoluene, acrylonitrile, vinyl chloride, vinylidene chloride, acrylamide, methacrylamide, methyl (meth)acrylate, ethyl (meth)acrylate, n-propyl (meth)acrylate, n-butyl (meth)acrylate, acrylate, 2-ethylhexyl (meth)acrylate, etc. Each of the above components (i) to (iv) may consist of one or more of the monomers as exemplified above.

When the amount of the aliphatic conjugated diene monomer (i) is less than the indicated lower limit, the resilience of the printing plate is inferior. When it is more than the upper limit, the water developability of the photosensitive resin plate becomes poor. When the amount of the $\alpha, \beta$-ethylenically unsaturated carboxylic acid (ii) is less than said lower limit, the water developability of the photosensitive resin plate becomes lower. When it is more than said upper limit, the water-resistance of the printing plate is inferior. When the amount of the polyfunctional vinyl monomer (iii) is less than said lower limit, the moldability of the photosensitive resin plate is lowered, whereas, when it is more than the upper limit, the resilience of the printing plate is lost. In the copolymer (A), the units of the polyfunctional vinyl monomer are believed to be covalently crosslinked and thus to contribute to solid form stability, water resistance, water-developability, and moldability.

The copolymer (A) may be prepared by conventional polymerization procedures. For instance, a mixture of the monomers may be subjected to emulsion polymerization in an aqueous medium containing potassium persulfate as a catalyst and sodium dodecylbenzenesulfonate as an emulsifier at a temperature of about 15° to 20° C.

The basic nitrogen-atom containing compound (B) is a compound having a tertiary basic nitrogen atom and preferably includes a vinyl group. Examples of suitable such compounds are N,N-dimethylaminoethyl (meth)acrylate, N,N-dimethylaminopropyl (meth)acrylamide, N,N-dimethylaminoethyl-N'-(meth)acryloylcarbamate, N,N-dimethylaminoethoxyethanol, N,N-dimethylaminoethoxyethoxyethanol, N,N-diethylaminoethoxyethyl (meth)acrylate, which may be used alone or in combination. In general, the nitrogen atom containing compounds may be depicted by the following structural formulas:

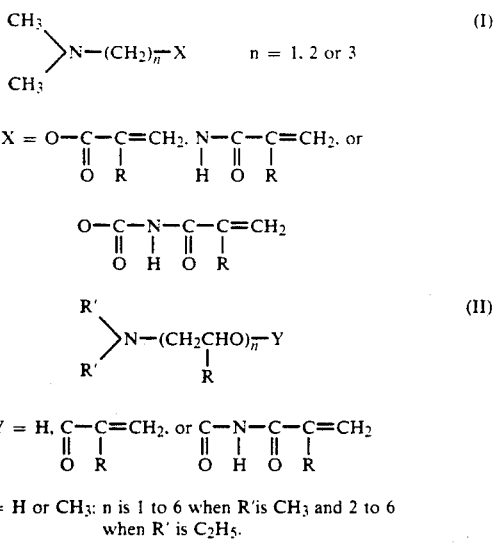

Preferred compounds are those of the foregoing structural formulas, except those of formula II when Y is H. Other nonphotopolymerizable amine compounds, such as 2-N-morpholinoethanol and 2-piperidinoethanol, may be used, in combination with the compounds mentioned in formula I or II.

The ethylenically unsaturated monomer (C) may be any compound having ethylenic unsaturation. Specific examples are unsaturated carboxylic esters (e.g., n-butyl (meth)acrylate, 2-ethylhexyl (meth)acrylate, lauryl (meth)acrylate, stearyl (meth)acrylate, polyethylene glycol mono(meth)acrylate, methoxypolyethylene glycol mono(meth)acrylate, polypropylene glycol mono(meth)acrylate, phenoxypolyethylene glycol mono(meth)acrylate, ethylene glycol di(meth)acrylate, diethylene glycol di(meth)acrylate, triethylene glycol di(meth)acrylate, diallyl itaconate, glycerol di(meth)acrylate, glycerol tri(meth)acrylate, 1,3-propylene glycol di(meth)acrylate, 1,4-cyclohexanediol di(meth)acrylate, 1,2,4-butanetriol tri(meth)acrylate, glycerol polypropylene glycol tri(meth)acrylate, 1,4-benzenediol di(meth)acrylate, pentaerythritol tetra(meth)acrylate, tetramethylene glycol di(meth)acrylate, 1,5-pentanediol di(meth)acrylate, 1,6hexanediol di(meth)acrylate, unsaturated amides (e.g. methylene bis(meth)acrylamide, ethylene bis(meth)acrylamide, 1,6hexamethylene bis(meth)acrylamide, diethylenetriamine tris(meth)acrylamide, N(hydroxymethyl)acryamide, N(hydroxymethyl)methacrylamide, N-($\beta$-hydroxyethyl)acrylamide, N-($\beta$-hydroxyethyl)methacrylamide, N,N'-bis($\beta$-hydroxyethyl)acrylamide, N-N'-bis($\beta$-hydroxyethyl)methacrylamide), divinyl esters (e.g., divinyl adipate, divinyl phthalate), acrylated or methacrylated urethanes derived from hydroxyalkyl acrylates or hydroxyalkyl methacrylates and isocyanate compounds, diacrylic or dimethacrylic esters or diepoxypolyethers derived from aromatic compounds with polyalcohols such as bisphenol or Novolac compounds, etc. One or more of these compounds may be used, and generally water-incompatible monomers are preferred.

The ethylenically unsaturated monomer (c) preferably includes a polyfunctional monomer to provide greater water resistance to the printing plates produced from the composition. Polyfunctional monomers that are compatible with the resin system may be used, including those identified above, as well as those described in U.S. Pat. No. 3,801,328, the disclosure of which is incorporated by reference herein. In the resin system of this invention, use of the polyfunctional monomer has been found to provide printing plates with increased water resistance, but does not impede the ability of the plates to be developed solely with water.

Examples of the photopolymerization initiator (D) are benzoin ethers (e.g. benzoin isopropyl ether, benzoin isobutyl ether), benzophenones (e.g., benzophenone, methyl o-benzoylbenzoate), xanthones (e.g., xanthone, thioxanthone, 2-chlorothioxanthone), acetophenones (e.g., acetophenone, trichloroacetophenone, 2,2-diethoxyacetophenone, 2,2-dimethoxy-2-phenylacetophenone), benzil, 2-ethylanthraquinone, methyl benzoylformate, 2-hydroxy-2-methylpropiophenone, 2-hydroxy-2-methyl-4'-isopropylisopropiophenone, 1-hydroxycyclohexylphenylketone, etc. They may be used alone or in combination.

In the photosensitive resin plate, the copolymer (A), the ethylenically unsaturated monomer (C) and the photopolymerization initiator (D), respectively may be from about 30 to 90% by weight, from about 5 to 70% by weight and from about 0.01 to 10% by weight. When the copolymer (A) is less than the indicated 30 weight %, it has been found that a satisfactory solid plate cannot be formed; if the copolymer exceeds approximately 90%, the photosensitive resin will not cure adequately. If the ethylenically unsaturated monomer (C) is less than about 5%, the composition will not cure adequately, and if it is more than about 70%, the solid retention is not good. If the photo-initiator (D) is used in a quantity less than 0.01%, the composition is not sufficiently light sensitive. If the photo-initiator is used in a quantity greater than about 10%, the resulting plate, following light exposure and development, will not provide an acceptable image. The amount of the basic nitrogen atom-containing compound (b) may be from about 0.20 to 2.0 mol to 1 mol of the carboxyl groups in the copolymer (A). When the amount of the basic nitrogen atom-containing compound (B) is less than said lower limit, the water developability of the photosensitive resin plate becomes poor. When more than said upper limit, the water resistance of the printing plate deteriorates.

For preparation of the photosensitive resin plate of the invention, a photosensitive resin composition comprising a uniform mixture of the components (A), (B), (C) and (D), may be molded in a melt state into an appropriate shape (e.g., sheet, plate) by a conventional procedure such as by extruding or calendering. The photosensitive resin composition may comprise additionally and optionally any conventional additives such as polymerization inhibitors (e.g., hydroquinone, hydroquinone monomethyl ether, mono-t-butylhydroquinone, catechol, p-t-butylcatechol, 2,6-di-t-butyl-p-cresol, benzoquinone, 2,5-diphenyl-p-benzoquinone, phenothiazine), dyes (e.g., eosin Y, rose-bengal), and plasticizers (e.g., dialkyl phthalate, dialkyl fumarate, dialkyl sebacate, dialkyl itaconate, alkyl phosphate, polyethyleneglycol, polyethyleneglycol esters, polyethyleneglycol ethers).

For preparation of the relief printing plate, the photosensitive resin plate as above obtained is exposed an actinic light source, such as ultraviolet light, through a negative film having an appropriate image so that the photo-polymerization takes place at the exposed areas to give a latent image. Development by washing out the photosensitive resin composition at the non-exposed areas with water gives a visible image, whereby a relief printing plate having high resistance to water and usable with water based inks is obtained. Advantageously, the relief printing plate has high abrasion resistance and good resilience so that it is quite suitable for flexographic printing.

The present invention will be hereinafter explained more in details by Examples and Comparative Examples wherein part(s) and % are by weight unless otherwise indicated.

The following methods are advantageously used to prepare the primer coat on the metal plate.

Method A

The surface of the iron plate had been previously coated with a primer of the following composition: 50 parts of an ammonia dispersion (A) comprising a copolymer of 49 mol % of butadiene, 7.5 mol % of methacrylic acid, 1.5 mol % of ethylene glycol dimethacrylate, 39 mol % of ethyl acrylate and 3 mol % of dicyclopentenyl oxyethyl acrylate and having a pH of 9.3, a viscosity of 25 cps/25° C. and a solid content of 18.5%, 20 parts of an ammonia dispersion (B) comprising a copolymer of ethylene and acrylic acid and having a pH of 9.3, a viscosity of 1,500 cps/25° C. and a solid content of 34%, 25 parts of a deionized aqueous solution (C) comprising 50% of a phthalocyanin paste and an epoxy type hardening agent and 5 parts of n-butanol (D). The primer coating has a viscosity of 2,500 cps/25° C. and was applied continuously onto a degreased, tin-free steel plate of 0.18 mm in thickness by the aid of a reverse coater, followed by drying in a gas furnace at 200° C. for 2 minutes. The final primer coating thickness was about 10 microns.

Method B

An aqueous dispersion of polyurethane, well mixed with pigment paste, was used as a primer solution. The solid content was approximately 30 weight %, and the viscosity was about 1300 cps/25° C. by Brookfield viscometer.

After the solution was applied onto a degreased steel plate, the coated substrate was dried for about 2 minutes at about 150° C. After drying, the primer thickness was approximately 10–15$\mu$.

EXAMPLE 1

To a copolymer (60 parts) comprising 49 mol % of butadiene, 7.5 mol % of methacrylic acid, 1.5 mol % of ethylene glycol dimethacrylate and 42 mol % of ethyl acrylate, were added N,N-dimethylaminoethylmethacrylate (5 parts; 0.51 mol to 1 mol of the carboxyl groups in the copolymer), phenoxyethoxyethanol (5 parts), methoxytripropyleneglycol acrylate (10 parts), nonaethylene glycol diacrylate (12 parts), trimethylolpropane trimethacrylate (5 parts), 2,2-dimethoxy-2-phenylacetophenone (1.6 parts), 2,6-di-t-butyl-p-cresol (0.3 part), p-methoxyphenol (0.1 part) and stearic acid (1.0 part). The resultant mixture was kneaded well by the aid of a pressurized two arm kneader. The thus obtained photosensitive resin composition was extruded through a kneader-extruder equipped with a T-die onto an iron plate to make a laminated plate having a photosenstive resin layer of about 0.40 mm in thickness with a mirror surface.

Onto the surface of the photosensitive resin layer of the photosensitive resin plate, a negative film having an appropriate image was closely contacted in vacuo, and irradiation was made with a 350 W chemical lamp for 1 minute, followed by development in water at 40° C. to give a printing plate having a relief image exactly corresponding to that of the negative film.

Using the printing plate, printing was carried out with an aqueous flexographic ink by the aid of a flexographic printing machine under a printing condition of 600 feet/minute. After printing 150,000 copies, no material change was produced at the surface of the printing plate.

COMPARATIVE EXAMPLE 1

Canadian patent 613,952

To a copolymer (15 parts) comprising 82.7 mol % of butadiene and 17.3 mol % of methacrylic acid, 2-diethylaminoethyl methacrylate (3 parts; 0.4 mol to 1 mol of the carboxyl groups in the copolymer), hydroquinone (0.2 part) and benzoin methyl ether (1 part) were added, followed by further addition of a mixture of dioxaneethanol (90:10) (85 parts) thereto. The resultant mixture was stirred well to make a uniform solution. At the edge portions on the four sides of the same iron plate as used in Example 1, a bank was provided, and said solution was poured within the bank. The resultant iron plate was allowed to stand in a dark place at room temperature, during which the solvent was evaporated to make a photosensitive resin layer of about 0.58 mm in total thickness, whereby a photosensitive resin plate was obtained.

Onto the surface of the photosensitive resin layer of the photosensitive resin plate, a negative film having an appropriate image was closely contacted in vacuo, and irradiation was made with a 350 W chemical lamp for 1 minute, followed by development in 1% aqueous sodium carbonate solution for 3 minutes to give a printing plate having a relief image of 0.08 mm in depth.

When dipped in an aqueous flexographic ink for newspaper at 40° C. for 2 hours, the printing plate gave a thickness swelling rate of 35%.

A plate of identical composition could not be processed with water.

COMPARATIVE EXAMPLE 2

In the same manner as in Example 1 but replacing the copolymer by a copolymer (60 parts) comprising 82.7 mol % of butadiene and 17.3 mol % of methacrylic acid and adjusting the molar ratio of N,N-dimethylaminoethyl methacrylate to the carboxyl groups in the copolymer to 0.18, there was prepared a photosensitive resin composition. This composition was extruded to make a sheet, which was simultaneously laminated at 80° C. on one surface of a supporting plate with intervention of a spacer by the aid of a press to make a photosensitive resin layer of 0.4 mm in thickness, whereby a photosensitive resin plate was obtained. The photosensitive resin layer was wrinkled at the surface and not suitable for preparation of a printing plate assuring good printing quality.

EXAMPLE 2

In the same manner as in Example 1 but replacing the copolymer by a copolymer (60 parts) comprising 61 mol % of butadiene, 2.5 mol % of methacrylic acid, 1.5 mol % of ethylene glycol dimethacrylate and 35 mol % of ethyl acrylate and adjusting the molar ratio of N, N-dimethylaminopropylacrylamide to the carboxyl groups in the copolymer to 1.53, there was prepared a photosensitive resin composition. This composition was extruded to make a sheet, which was simultaneously laminated at 80° C. on one surface of a supporting plate with intervention of a spacer by the aid of a press to make a photosensitive resin layer of 0.4 mm in thickness, whereby a photosensitive resin plate was obtained. Using the printing plate, printing was carried out with an aqueous flexographic ink for newspaper by the aid of a flexographic printing machine under a printing speed of 120 feet/minute. Printing could be performed smoothly without producing any mottling.

EXAMPLE 3

In the same manner as in Example 1 but replacing the copolymer by a copolymer (60 parts) comprising 52 mol % of butadiene, 8.5 mol % of methacrylic acid, 2.5 mol % of divinylbenzene and 37 mol % of ethyl acrylate and adjusting the molar ratio of N,N-dimethylaminopropylmethacrylamide to the carboxyl groups in the copolymer to 0.47, there was prepared a photosensitive resin composition. This composition was extruded to make a sheet, which was simultaneously laminated on one surface of a supporting plate to make a photosensitive resin layer of 0.4 mm in thickness, whereby a photosensitive resin plate was obtained. Using the printing plate, printing was carried out in the same manner as in Example 1 to give a sharp image.

EXAMPLE 4

In the same manner as in Example 1 but replacing the copolymer by a copolymer (60 parts) comprising 49 mol % of butadiene, 7.5 mol % of methacrylic acid, 2.5 mol % of 1,4-butanediol diacrylate and 41 mol % of ethyl acrylate and adjusting the molar ratio of N,N-dimethylaminoethyl-N'-methacryloylcarbamate to the carboxyl groups in the copolymer to 0.44, there was prepared a photosensitive resin composition. This composition was extruded to make a sheet, which was simultaneously laminated on one surface of a supporting plate to make a photosensitive resin layer of 0.4 mm in thickness, whereby a photosensitive resin plate was obtained. Using the printing plate, printing was carried out in the same manner as in Example 1 to give a sharp image.

COMPARATIVE EXAMPLE 3

In the same manner as in Comparative Example 2 but replacing the copolymer by a copolymer (60 parts) comprising 24 mol % of methacrylic acid, 1 mol % of ethylene glycol dimethacrylate, 59 mol % of ethyl acrylate and 16 mol % of methoxyethyl acrylate and adjusting the molar ratio of N,N-dimethylaminoethyl methacrylate to the carboxyl groups in the copolymer to 0.23, there was prepared a photosensitive resin composition. This composition was extruded to make a sheet, which was simultaneously laminated at 80° C. on one surface of a supporting plate with intervention of a spacer by the aid of a press to make a photosensitive resin layer of 0.4 mm in thickness, whereby a photosensitive resin plate was obtained. The photosensitive resin layer had slight roughness at the surface.

In the same manner as in Example 1, a relief image was made using the photosensitive resin plate. When the resultant printing plate was dipped in an aqueous flexographic ink for newspaper at 40° C. for 2 hours, it showed a swelling rate of 4.9% in thickness. The impact resilience as determined by JIS (Japanese Industrial Standard) 6301 was as low as 3% at 20° C.

COMPARATIVE EXAMPLE 4

In the same manner as in Comparative Example 2 but replacing the copolymer by a copolymer (60 parts) comprising 7.5 mol % of methacrylic acid, 1.5 mol % of ethylene glycol dimethacrylate, 59 mol % of ethyl acrylate and 32 mol % of methoxyethyl acrylate and adjusting the molar ratio of N,N-dimethylaminoethyl methacrylate to the carboxyl groups in the copolymer to 0.51, there was prepared a photosensitive resin composition. This composition was extruded to make a sheet, which was simultaneously laminated at 80° C. on one surface of a supporting plate with intervention of a spacer by the aid of a press to make a photosensitive resin layer of 0.4 mm in thickness, whereby a photosensitive resin plate was obtained. The photosensitive resin layer had slight roughness at the surface.

In the same manner as in Example 1, a relief image was made using the photosensitive resin plate. When the resultant printing plate was dipped in an aqueous flexographic ink for newspaper at 40° C. for 2 hours, it showed a swelling rate of 4.9% in thickness. The impact resilience as determined by JIS (Japanese Industrial Standard) 6301 was as low as 3% at 20° C.

EXAMPLE 5

In the same manner as in Example 1 but using the copolymer as used in Example 1 (65.5 parts), N,N-dimethylaminoethoxyethanol (5 parts; 0.41 mol to 1 mol of the carboxyl groups in the copolymer), 2-ethylhexyl methacrylate (20 parts), 1,4-butanediol dimethacrylate (2.5 parts), phenoxyethoxyethanol (5 parts), 2,2-dimethoxy-2-phenylacetophenone (1.6 parts), 2,6-di-t-butyl-p-cresol (0.3 part) and p-methoxyphenol (0.1 part), there was prepared a photosensitive resin plate.

Onto the surface of the photosensitive resin layer of the photosensitive resin plate, a negative film having an appropriate image was closely contacted in vacuo, followed by irradiation with a 350 W chemical lamp for 1.2 seconds as bump exposure and 40 seconds as main exposure. Development was effected by washing out with water at 40° C. for 30 seconds to give a printing plate having a relief image.

Using the printing plate, printing was carried out in the same manner as in Example 1 to give a sharp image.

EXAMPLE 6

To a copolymer (60 parts) comprising 81.5 mol % of butadiene, 4.5 mol % of methacrylic acid, 1.5 mol % of ethylene glycol dimethacrylate and 12.5 mol % of methylmethacrylate, N,N-dimethylaminopropylmethacrylamide (3.6 parts; 0.50 mol to 1 mol of carboxyl groups in the copolymer), 2-N-morpholinoethanol (1.4 parts; 0.25 mol to 1 mol of carboxyl groups in the copolymer), phenoxyethoxyethanol (6 parts), pentapropyleneglycol monomethacrylate (18 parts), glycerolpropylene glycol trimethacrylate (6 parts), lauryl methacrylate (3 parts), 2,2-dimethoxy-2-phenylacetophenone (1.6 parts), and 2,6-di-t-butyl-p-cresol (0.4 part) were added.

The thus obtained photosensitive resin composition was extruded through a kneader-extruder equipped with a T-die onto the primer coated iron plate to make a laminated plate having a photosensitive resin layer of about 0.4 mm in thickness having a mirror surface.

Using this plate, processing and printing were carried out in the same manner as in Example 1 to give a sharp image.

Some properties of the photosensitive resin plates and the printing plates obtained in Examples and Comparative Examples as above are shown in the following Table.

water resistant and capable of use with water based inks. The printing plate is resilient enough to provide an excellent printing quality.

While the invention has been described primarily with respect to relief printing plates, it should be recognized that it may also be used to make plates for offset printing or for screen printing. By the same token, while specific embodiments of the invention have been disclosed, it should be understood that modifications and equivalents of such embodiments as will be apparent to those skilled in the art; are to be within the scope of the invention.

We claim:

1. A water-developable photosenstive composition for use in the preparation of relief printing plates, consisting essentially of:
   (A) about 30 to about 90% by weight of a copolymer comprising units of (i) an aliphatic conjugated diene monomer, (ii) an α,β-ethylenically unsaturated carboxylic acid, and (iii) a polyfunctional vinyl monomer, the content of the aliphatic conjugated diene monomer (i), the α,β-ethylenically unsaturated carboxylic acid (ii), and the polyfunctional vinyl monomer (iii) being respectively from about 5 to 95 mol %, from about 1 to 30 mol %, and from 0.1 to 10 mol % based on the combination of said monomeric components;
   (B) about 0.20 to 2.0 mol, based on 1 mol of the carboxyl groups in said copolymer (A), of a basic nitrogen atom-containing compound having a tertiary basic nitrogen atom;
   (C) about 5 to 70% by weight of an ethylenically unsaturated monomer; and
   (D) about 0.1 to 10% by weight of a photopolymerization initiator, the amounts of said copolymer (A), said ethylenically unsaturated monomer (C), and said photopolymerization initiator (D) being based on the total weight of said composition; said composition, upon application to a support and exposure to light, being developable in the unexposed areas solely with water to form a relief printing plate that is resistant to swelling with water-based inks.

2. The photosensitive resin composition according to claim 1, wherein the content of the aliphatic conjugated diene monomer (i), the α,β-ethylenically unsaturated carboxylic acid (ii) and the polyfunctional vinyl monomer (iii) in the copolymer (A) are respectively from

TABLE

| Example | Water developability (Time for washing out) (Seconds) | Resilience 20° C. (%) | Shore A hardness 20° C. (°) | Swelling rate in aqueous ink dipping test 40° C. × 2 hrs (%) | Alkali developability with 1% $Na_2CO_3$ |
|---|---|---|---|---|---|
| 1 | 30 | 20 | 78 | 2.5 | |
| Comparative 1 | Washing out impossible | 30 | 70 | 35.0 | Relief of 80μ in depth after 3 minutes |
| Comparative 2 | Washing Out impossible | 32 | 68 | 40.0 | Relief of 10μ in depth after 3 minutes |
| 2 | 35 | 35 | 66 | 1.2 | |
| 3 | 35 | 20 | 78 | 1.8 | |
| 4 | 30 | 20 | 78 | 2.5 | |
| Comparative 3 | 20 | 3 | 81 | 20.0 | |
| Comparative 4 | 30 | 3 | 80 | 4.9 | |
| 5 | 25 | 25 | 72 | 5.2 | |
| 6 | 35 | 28 | 74 | 4.0 | |

It will thus be appreciated from the foregoing, especially the illustrative examples, that the photosensitive printing plate of the present invention is developable with water, and the printing plate therefrom is quite about 40 to 85 mol %, from about 2.5 to 10 mol %, from about 0.5 to 3 mol %.

3. The photosensitive resin composition of claim 1 or 2 wherein said copolymer (A) further includes units of a monofunctional vinyl monomer in an amount of up to 70 mol %, based on the combination of the total amount of said monomeric components.

4. The water-developable photosensitive resin composition according to claim 1 or 3 wherein the basic nitrogen atom-containing compound (B) is represented by the structural formula:

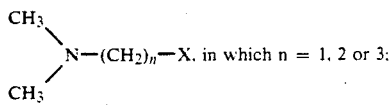

(I)

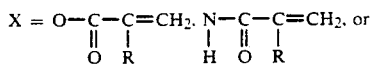

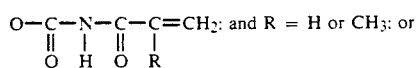

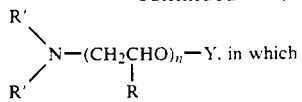

(II)

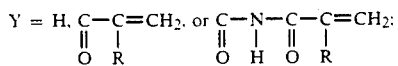

R = H or $CH_2$; n is 1 to 6 when R' is $CH_3$ and 2 to 6 when R' is $C_2H_5$.

5. The water-developable photosensitive resin composition according to claim 4, wherein the basic nitrogen atom-containing compound (B) is a photopolymerizable amine compound expressed in formula (I) or (II) except compounds corresponding to formula (II) in which Y is hydrogen.

6. The water-developable photosensitive resin composition according to any of claims 1 or 3, which is supported on a supporting material.

7. The photosensitive resin composition of claims 1, 2, 4 or 3 in which said ethylenically unsaturated monomer (C) includes a polyfunctional monomer.

* * * * *